June 25, 1968 C. H. FA 3,390,022

SEMICONDUCTOR DEVICE AND PROCESS FOR PRODUCING SAME

Filed June 30, 1965 2 Sheets-Sheet 1

INVENTOR.
CHARLES H. FA

BY Robert S. Rogers

ATTORNEY

SEMICONDUCTOR DEVICE AND PROCESS FOR PRODUCING SAME

Filed June 30, 1965 2 Sheets-Sheet 2

INVENTOR.
CHARLES H. FA

BY Robert G Rogers
ATTORNEY

United States Patent Office 3,390,022

Patented June 25, 1968

3,390,022

SEMICONDUCTOR DEVICE AND PROCESS FOR PRODUCING SAME

Charles H. Fa, Costa Mesa, Calif., assignor to North American Rockwell Corporation, a corporation of Delaware Filed June 30, 1965, Ser. No. 468,202
2 Claims. (Cl. 148—33)

This invention relates to electrically isolated semiconductor devices on a common crystalline substrate and to a process for producing the devices.

The composite of the invention provides semiconductor devices on a common crystalline substrate with relatively good electrical isolation and substantially reduced parasitic capacitance between devices. In addition to these improved electrical characteristics, the structure allows a relatively inexpensive method for producing isolated semiconductor devices such as diodes and transistors, including complementary transistors, in many combinations and arrangements. A distinct advantage of the structure is that it makes it possible to simultaneously produce most, and in many arrangements, all semiconductor junctions with one diffusion process.

The process of the invention comprises the steps of producing a layer of dielectric material on one side of a semiconductive body, such as silicon dioxide on a p-type silicon wafer; producing a crystalline substrate on the dielectric material; and diffusing desired junctions from the surface on the other side of the semiconductive body down to the layer of dielectric material. For best results, the dielectric material should consist of substantially the same material as the semiconductive body, or a compound thereof, so that it will be thermally compatible with the semiconductor body and crystalline substrate. By thermal compatibility it is meant that the composite will withstand wide variations in processing and operating temperatures without producing stresses, strains, separations or fractures in the final structure or otherwise impairing its functional operation. An oxide or nitride of the semiconductor itself is a dielectric material ideally suited for this purpose, but other dielectric materials may be employed in some arrangements or structures.

The desired junctions are subsequently so produced using conventional diffusion techniques that the diffusion front terminates at the layer of dielectric material. Thus areas having net acceptor impurities and net donor impurities, or multiple p-n junctions having identical or symmetrical properties, are formed simultaneously within the semiconductive body. Since the diffusion for all vertical junctions is completed in one operation, the impurity profiles of those junctions are the same. For example, if a p-type semiconductive body is used, selected areas will be diffused with a donor impurity from the surface of the semiconductive body to the layer of dielectric material, thereby simultaneously producing multiple p-n junctions. Conductors are then deposited to electrically interconnect selected areas of the semiconductive body for producing an integrated circuit as desired.

An object of this invention is to provide electrically isolated regions of a semiconductive body on a common crystalline substrate with low parasitic capacitance between adjacent regions.

Another object of this invention is to provide devices in electrically isolated regions of a semiconductive body on a common crystalline substrate with extremely low leakage current between a given device and other devices on the substrate.

Another object is to provide a process for electrically isolating regions of a semiconductive body on a common crystalline substrate with low parasitic capacity between adjacent regions.

It is still another object of this invention to provide a process for producing electrically isolated regions of a semiconductive body on a common crystalline substrate and devices in those regions.

It is a further object of this invention to provide an improved process for producing in a semiconductive body isolated devices requiring symmetrical or identical junctions.

It is still a further object of this invention to produce a semiconductive body having a dielectric insulation layer thermally compatible with a polycrystalline substrate.

These and other objects of the invention will become apparent from the following description in connection with illustrative examples and drawings of which:

FIGURES 1*a* to 1*f* depict steps of a process for producing electrically isolated semiconductive devices on a common crystalline substrate in accordance with the present invention;

Figure 1A:
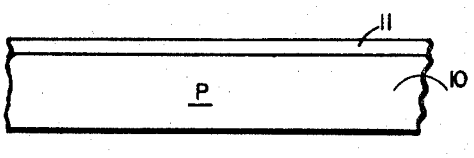

Referring now to FIGURE 1*a*, a wafer 10 of semiconductive material, such as n or p-type single crystal, is selected. The material may be selected from the various semiconductive materials such as silicon, germanium, gallium arsenside, gallium phosphide, indium antimonide, indium arsenide, and silicon carbide. For purposes of describing an illustrative embodiment of the invention, p-type silicon is chosen.

An insulating layer 11 of dielectric material is produced on one surface of the single crystal 10 by conventional means such as thermal oxidation or pyrolytic oxide decomposition of the silicon wafer 10, or vacuum deposition. Thus the dielectric material may be comprised of silicon dioxide or silicon nitride, or other dielectric materials such as beryllium oxide or aluminum oxide, all of which are thermally compatible with the material selected for the wafer 10 and the subsequently deposited substrate.

Figure 1B:
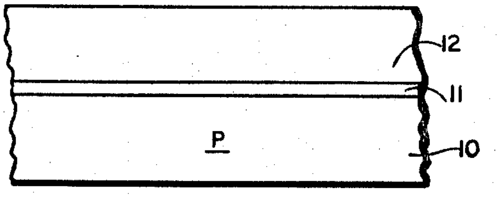

In the next step depicted in FIGURE 1*b*, a crystalline substrate 12 is vapor deposited on the dielectric layer 11 such as polycrystalline silicon epitaxially grown.

Figure 1C:
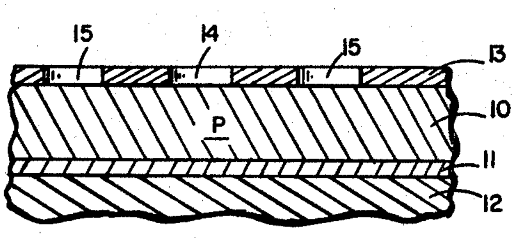

The composite structure is then inverted and the wafer 10 is cleaned and reduced to a thickness suitable for production of electrically isolated regions and devices. For example, a thickness of approximately 6 microns might be suitable for producing a diode matrix in accordance with the present invention. The cleaned surface of the wafer 10 is then oxidized to form a protective layer 13 which is selectively etched in areas 14 and 15 to form a mask as illustrated in FIGURE 1*c* for the subsequent diffusion step illustrated in FIGURE 1*d*. The geometry of the exposed areas 14 and 15 of the single crystal wafer 10 may be more clearly seen in FIGURE 1*d*.

Figure 1D:
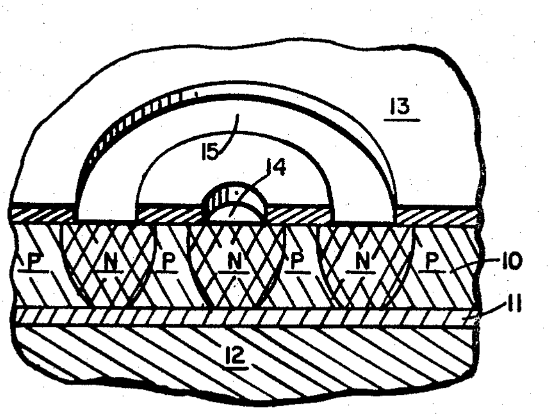

The exposed areas 14 and 15 of the semiconductor wafer 10 are diffused with a suitable donor impurity such as $P_2O_5$, $P_3N_5$, or $PH_3$. For an n-type wafer, suitable acceptor impurities are $B_2O_3$, $BCl_3$ and $B_2H_6$. The diffusion is allowed to progress vertically into the single crystal wafer 10 until the insulating layer 11 is reached as shown in FIGURE 1*d*. Further diffusion thereafter will increase the lateral diffusion which will decrease the distance between adjacent junctions. However, the rate of lateral diffusion is much slower than that along the vertical direction. The separation of adjacent junctions can be controlled with mask spacing and diffusion scheduling for a proper separation dimension consistent with the requirement for the devices being produced.

Figure 1E:
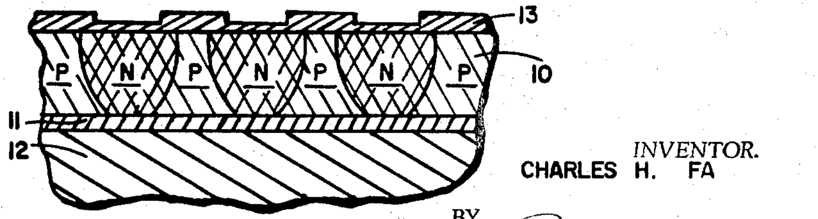

The exposed areas 14 and 15 actually become reoxidized during the diffusion operation as shown in FIGURE 1*e* due to the existence of oxygen at high temperature.

Figure 1F:
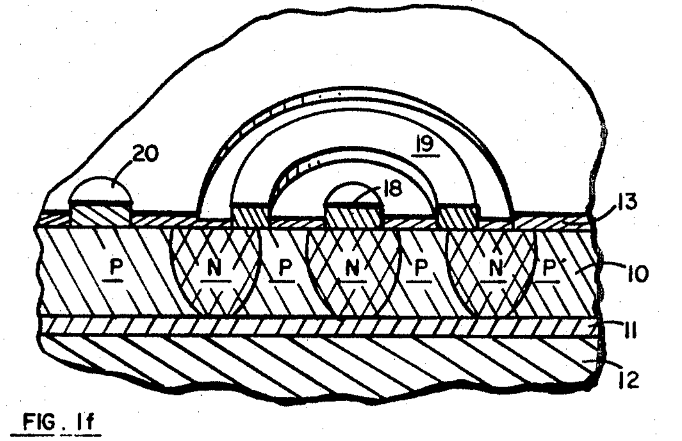

In the next step, the insulating layer 13 is re-etched to expose selected areas which are coated with an electrical conducting material such as gold, nickel, silver, chromium, aluminum or molybdenum to form contacts 18, 19 and 20 as shown in FIGURE 1*f*. Contact 19 is so deposited as to short a p-n junction and to connect two diodes in series, one diode consisting of a p-n junction between contact 18 and the contact 19 and the other diode consisting of a p-n junction between the contact 19 and the contact 20.

Figure 2:
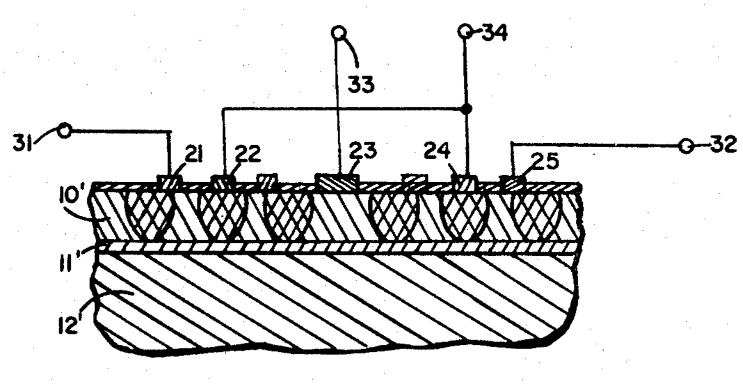
FIGURE 2 shows a larger portion of the composite of FIGURE 1*f* and illustrates a way of connecting isolated semiconductive devices to provide an integrated circuit.
Figure 3:
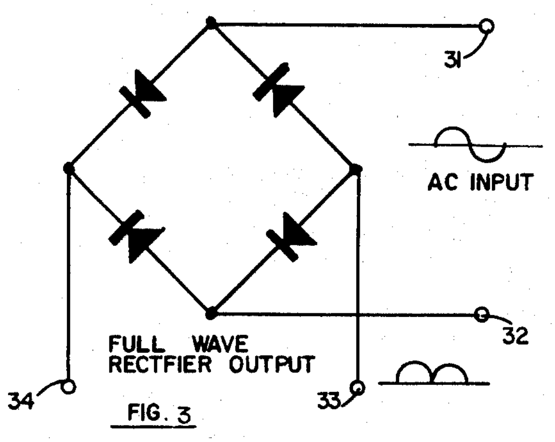
FIGURE 3 is a schematic diagram of the integrated circuit of FIGURE 2.

In FIGURE 2, there is shown a structure similar to that of FIGURE 1*f* except that it includes another pattern of diffused regions. As before, all diffused regions are from the surface of the silicon wafer 10' to the layer of dielectric material 11' to form vertical p-n junctions. Five contacts 21, 22, 23, 24 and 25 are deposited to provide two pair of series-connected diode junctions. The contacts are then so interconnected that the four diodes form a full wave rectifier as illustrated schematically in FIGURE 3 with input terminals 31 and 32, and output terminals 33 and 34.

The composite of the invention is more fully illustrated by the following examples.

Example I

A high quality p-type single crystal silicon wafer having a thickness of 5 to 10 mils and smooth surface was oxidized to produce an insulating layer of approximately 1 micron thick by a conventional thermal oxidation technique such an exposure to steam at 1100° C. for approximately two hours, or dry oxygen at 1250° C. for approximately 16 hours.

Subsequently, a polycrystalline silicon substrate of approximately 6 mils was grown on the insulation layer by the well-known process of hydrogen reduction of trichlorosilane at 1100° to 1200° C. for approximately two hours.

After the growth was completed, the single crystal silicon layer was lapped and polished to an approximate thickness of 6 microns and was reoxidized again to produce a surface oxide layer of approximately 5000 A. thick.

The surface oxide layer was selectively etched with the conventional photolithographic technique for an array of ring and dot patterns exposing the single crystal silicon surface for a diode matrix similar to that illustrated in FIGURE 2 but with a larger number of diode pairs. The center dot diameter was approximately 0.004 inch. The ring outer diameter was 0.010 inch and the inner diameter was 0.007 inch. For that particular embodiment, the ring and dot patterns were so arranged as to be able to deposit interconnections without any one connection crossing over another.

Following the photolithographic process, foreign particles were removed from the surface by means of etching in sulfuric acid and rinsing in distilled water. The selectively etched silicon wafer was then placed in a diffusion furnace maintained at a temperature of 1000 to 1100° C. for diffusing with a donor impurity ($P_2O_5$) through the openings provided by the etched dots and rings down to the insulating layer of dielectric material. A single diffusion process was used. The wafer was first exposed to the donor impurity in an atmosphere of nitrogen and oxygen for a limited time. Other dopants such as $P_3N_5$, $PH_3$, $POCl_3$, etc., could also have been used. The atmosphere was then replaced with pure oxygen at the same temperature to reoxidize the ring and dot areas and complete the diffusion process for the formation of substantially vertical p-n junctions from the embedded dielectric insulating layer to the surface oxide layer.

A second photolithographic process was performed to remove the surface oxide from the areas selected for making electrical contacts to the single crystal silicon. After the electrical contact areas were exposed, the substrate was inserted in a vacuum chamber at a pressure of approximately $10^{-7}$ millimeters of mercury and aluminum was deposited onto the entire wafer surface at a relatively low temperature (about 300°). Another photolithographic process was used to etch off the excessive aluminum and to form appropriate interconnections and contacts to the selected areas of the single crystal silicon surface. Other electrical conductive materials such as gold, silver, nickel, chromium, molybdenum, etc., could also have been used for the electrical contact and interconnections.

Although it was not a problem in the particular example just described, when aluminum is used, the contact areas on n-type semiconductive material should be highly diffused with donor impurities to avoid p-n junction formation between the aluminum material which is in Group III and the single crystal silicon material. That also helps reduce contact resistance. However, in this example, it was not necessary to take such a precaution since p-type semiconductive material was used.

The wafer was then diced into diode arrays which were tested before packaging. One diode array contained 280 diode pairs and had an over-all size of 0.6 x 0.3 sq. inch.

The full wave rectifier circuit illustrated in FIGURE 2 may be formed from two diode pairs. If a higher current capacity is required, a plurality of diode pairs can be so connected together as to provide parallel diodes for each branch of the rectifier circuit.

Example II

A process substantially similar to the one described above was repeated using an n-type single crystal silicon as starting material and an acceptor impurity (boron) for diffusion to form the p-n junctions. After that diffusion, a shallow diffusion of a donor impurity was made in the areas requiring metal contacts in order to avoid p-n junction formation between the single crystal silicon and the aluminum which was deposited for the electrical contacts.

Example III

Figure 4:
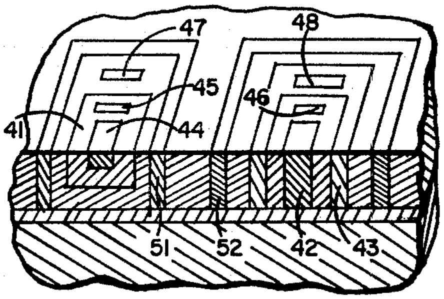
FIGURE 4 is an illustration of a second embodiment of the present invention.

Complementary PNP and NPN devices were produced in a single silicon crystal using the geometry shown in FIGURE 4 by selectively diffusing deceptor and donor impurities into the silicon crystal. Substantially the same process as described in the preceding examples was followed except that rectangular patterns were used.

A p-type single crystal wafer was used as the starting material. Phosphorous was diffused to create the n-type areas shown as areas 42, 43, 51 and 52. Arsenic or antimony, a slower diffusant, was used to form another n-type area 41 for the base and boron was used to diffuse the p-type area 44 for the emitter of the PNP transistor. Thus the PNP transistor on the left was formed with a conventional double diffusion process. Metal contacts 45 and 46 were deposited as base contacts for the devices and metal contacts 47 and 48 were deposited as collector contacts for the devices. Other contacts were also added to the emitters 42 and 44. Areas 51 and 52 were diffused to form isolation walls around the PNP and NPN transistors.

The base width of the NPN transistor on the right, i.e., the separation of areas 42 and 43 of FIGURE 4 may be controlled by mask spacing and adjusting the diffusion sequence and schedules. For example, if a prolonged diffusion is permitted after the diffusion has reached the insulation layer, the junction fronts will tend to flange outwardly and reduce the area separating the two diffused areas and hence reduce the base width.

In the prior art, monolithic integrated semiconductor devices were known to have undesirable parasitic capacitance because they were isolated by p-n junctions across the bottom as well as on all sides, and the area across the bottom is very large as compared to the total area of the side walls since conventional transistors, diodes and resistors are produced by shallow diffusion of large areas. For the structure of the present invention, the bottom component of parasitic capacitance is eliminated and the remaining sidewall component of the capacitance is substantially reduced because of its ability to use a very thin layer of active bulk material over a layer of dielectric material. In addition, for the same size devices and sidewall areas, the sidewall capacitance is reduced by a factor of 2 because double sidewalls are provided for isolation. The leakage between isolated regions is also reduced by the insulating layer of dielectric material along the bottom and the double sidewalls surrounding each region. Moreover, reverse biasing of the sidewall p-n junctions is not necessary for most applications. Each region may be freely used for the production of one or more active and passive elements, or complete functional circuits.

It should be noted that an additional advantage of the present invention is the symmetrical capability of the devices produced by vertical diffusion from the surface to the layer of dielectric material. For instance, in the NPN transistor of FIGURE 4, the emitter and collector terminals are reversible. That feature is highly desirable for various switching applications which is not attainable with the prior art double diffusion technique alone.

Although the invention has been described and illustrated in detail, it is to be understood that the same is by way of illustration and example only, and is not to be taken by way of limitation; the spirit and scope of this invention being limited only by the terms of the appended claims.

I claim:

1. The composite comprising a crystalline body of a given conductivity type having two major sides, a layer of dielectric material on a first major side, a crystalline substrate on the dielectric material, and selected zones diffused from the second major side of said crystalline body down to said layer of dielectric material with impurities selected to produce in said crystalline body zones of a conductivity type opposite said given conductivity type, thereby providing p-n junctions extending from the surface of said dielectric material to the surface of said crystalline body.

2. The composite comprising a crystalline body of a given conductivity type having two major sides, a layer of dielectric material on a first major side, a polycrystalline substrate disposed on said dielectric material, and diffused zones of a conductivity type opposite said given conductivity type, providing p-n junctions extending from the surface of said dielectric material to the surface of said crystalline body.

References Cited

UNITED STATES PATENTS

| | | | |
|---|---|---|---|
| 2,981,877 | 4/1961 | Noyce | 148—187 XR |
| 3,015,762 | 1/1962 | Shockley | 317—234 |
| 3,117,260 | 1/1964 | Noyce | 317—235 |
| 3,150,299 | 9/1964 | Noyce | 148—33 XR |
| 2,171,068 | 2/1965 | Denkewalter et al. | 148—33 XR |
| 3,349,299 | 10/1967 | Herlet | 317—235 |
| 3,332,137 | 7/1967 | Kenney | 317—235 XR |

HYLAND BIZOT, *Primary Examiner.*

P. WEINSTEIN, *Assistant Examiner.*